US009224705B2

(12) United States Patent
Tajimi

(10) Patent No.: US 9,224,705 B2
(45) Date of Patent: Dec. 29, 2015

(54) SEMICONDUCTOR DEVICE

(71) Applicant: SEIKO EPSON CORPORATION, Tokyo (JP)

(72) Inventor: Shigehisa Tajimi, Shonai-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/196,316

(22) Filed: Mar. 4, 2014

(65) Prior Publication Data

US 2014/0291836 A1 Oct. 2, 2014

(30) Foreign Application Priority Data

Mar. 27, 2013 (JP) ................................. 2013-065775

(51) Int. Cl.
*H01L 23/48* (2006.01)
*H01L 23/00* (2006.01)
*H01L 21/56* (2006.01)
*H01L 23/498* (2006.01)

(52) U.S. Cl.
CPC .............. *H01L 24/10* (2013.01); *H01L 21/563* (2013.01); *H01L 23/4985* (2013.01); *H01L 23/49838* (2013.01); *H01L 24/14* (2013.01); *H01L 24/32* (2013.01); *H01L 24/16* (2013.01); *H01L 24/83* (2013.01); *H01L 2224/14151* (2013.01); *H01L 2224/14155* (2013.01); *H01L 2224/14177* (2013.01); *H01L 2224/14515* (2013.01); *H01L 2224/16225* (2013.01); *H01L 2224/16227* (2013.01); *H01L 2224/32013* (2013.01); *H01L 2224/32052* (2013.01); *H01L 2224/73204* (2013.01); *H01L 2224/83102* (2013.01)

(58) Field of Classification Search
CPC .... H01L 23/564; H01L 23/3121; H01L 24/10
USPC .......................................................... 257/737
See application file for complete search history.

(56) References Cited

U.S. PATENT DOCUMENTS

| 2002/0003293 | A1* | 1/2002 | Kobayashi | 257/676 |
| 2002/0125561 | A1* | 9/2002 | Hashimoto | 257/692 |
| 2004/0108594 | A1* | 6/2004 | Toyosawa | 257/734 |
| 2004/0178501 | A1* | 9/2004 | Son et al. | 257/735 |

(Continued)

FOREIGN PATENT DOCUMENTS

| JP | A-2004-193223 | 7/2004 |
| JP | A-2005-93468 | 4/2005 |

(Continued)

*Primary Examiner* — Christine Enad
(74) *Attorney, Agent, or Firm* — Oliff PLC

(57) ABSTRACT

A semiconductor device includes a substrate having a plurality of electrodes and a plurality of leads that are connected to the electrodes and a semiconductor element that is mounted on the substrate. The semiconductor element has a rectangular shape including a long side, a short side, and a corner portion, and has bumps connected to the electrodes. An underfill is filled between the substrate and the semiconductor element and extends on the substrate around the semiconductor element. An overcoat covers the leads on the substrate. At least one of the plurality of leads that is connected to the electrode corresponding to the bump arranged nearest to the corner portion along the long side of the semiconductor element has at least two successive bent portions that are bent in the same direction and is laid out toward the short side of the semiconductor element in a plan view.

10 Claims, 7 Drawing Sheets

(56) References Cited

U.S. PATENT DOCUMENTS

| | | | |
|---|---|---|---|
| 2006/0145315 A1* | 7/2006 | Shen et al. | 257/668 |
| 2007/0178627 A1* | 8/2007 | Jiang et al. | 438/108 |
| 2008/0251894 A1* | 10/2008 | Kojima et al. | 257/659 |
| 2009/0008132 A1* | 1/2009 | Takasawa et al. | 174/254 |
| 2009/0116203 A1* | 5/2009 | Matsuno et al. | 361/760 |
| 2009/0189274 A1* | 7/2009 | Kim | 257/692 |
| 2011/0100687 A1 | 5/2011 | Hong et al. | |

FOREIGN PATENT DOCUMENTS

| | | |
|---|---|---|
| JP | A-2006-80167 | 3/2006 |
| JP | A-2011-97000 | 5/2011 |

\* cited by examiner

SEMICONDUCTOR DEVICE

CROSS-REFERENCE TO RELATED APPLICATIONS

This application claims priority to Japanese Patent Application No. 2013-065775 filed on Mar. 27, 2013.

The entire disclosure of Japanese Patent Application No. 2013-065775 is hereby incorporated herein by reference.

BACKGROUND

1. Technical Field

The present invention relates to a semiconductor device in which a semiconductor element having bumps is mounted on a substrate having electrodes and leads that are connected to the electrodes.

2. Related Art

In semiconductor devices in which a semiconductor element is mounted on a substrate, a method is used in which the semiconductor element is placed on the substrate, after bumps of the semiconductor element are positioned on corresponding electrodes on the substrate, and the substrate and the semiconductor element are fixed by an underfill. The underfill has a function to protect the electrodes and leads of the substrate and the bumps of the semiconductor element from corrosion caused by ambient air or moisture, along with fixing the semiconductor element. The leads are connected to the respective electrodes on the substrate, laid out in a region of the substrate that are covered by the underfill (underfill region), and further led out from the underfill region.

The substrate has a region (overcoat region) covered by an overcoat such that the overcoat region is continuous to or overlaps with the underfill region. Portions of the leads that are outside the underfill region on the substrate are covered by the overcoat in order to protect them from corrosion caused by moisture, or the like.

The leads on the substrate are laid out in various patterns. Heretofore, the patterns described e.g. in JP-A-2004-193223 and JP-A-2005-93468 have been disclosed.

The underfill is dripped, after the semiconductor element is placed on the substrate, along one of the long sides of the semiconductor element, is filled between the substrate and the semiconductor element, and extends such that all the regions between the semiconductor element and the substrate and regions on the substrate adjacent to all sides of the semiconductor element are covered. However, since the semiconductor element is, in general, formed in a rectangular shape and has corner portions, an extension amount of the underfill in regions on the substrate adjacent to the corner portions of the semiconductor element is smaller than an extension amount of the underfill in regions adjacent to the sides of the semiconductor element.

Due to the extension amount of the underfill being small in the regions adjacent to the corner portions, hollows are generated between the underfill region and the overcoat region in these regions, that is regions (hollow regions) on the substrate that are not covered by any of the underfill and the overcoat. As with the layout pattern shown in JP-A-2004-193223, for example, if the leads are led out straight from the underfill region across the nearest long side of the semiconductor element in a plan view, at least a lead that is connected to an electrode on the substrate provided nearest to the corner portion passes through the hollow region, and as a result the lead may suffer from corrosion by moisture or the like.

Thus, as with the lead layout pattern shown in JP-A-2005-93468, a lead layout has been proposed in which the lead connected to an electrode near the corner portion is laid out being bent toward the short side instead of being led out from the long side. However, in this lead layout pattern, since the lead has only one bent portion of a right angle, there is a problem in that the fluidity of the underfill that extends along the bent portion can be reduced, bubbles can be generated in the underfill at the bent portion, and as a result corrosion can occur in the lead caused by moisture or the like penetrated through residues of the bubbles or the bubbles.

SUMMARY

An advantage of some aspects of the invention can be achieved in the following modes or application examples.

Application Example 1

A semiconductor device according to this application example includes a substrate having a plurality of electrodes and a plurality of leads that are connected to the electrodes; a semiconductor element that is mounted on the substrate, the semiconductor element having a rectangular shape including a long side, a short side, and a corner portion, and having bumps connected to the electrodes; an underfill that is filled between the substrate and the semiconductor element and extends on the substrate around the semiconductor element; and an overcoat that covers the leads on the substrate. At least one of the plurality of leads that is connected to the electrode corresponding to the bump arranged nearest to the corner portion along the long side of the semiconductor element has at least two successive bent portions that are bent in the same direction and is laid out toward the short side of the semiconductor element in a plan view.

According to this application example, since the lead is covered by the underfill, the generation of bubble in the underfill at the bent portion of the lead can be suppressed, highly reliable semiconductor device in which corrosion of the lead is unlikely to occur can be provided.

Application Example 2

A semiconductor device according to this application example includes a substrate having a plurality of electrodes and a plurality of leads that are connected to the electrodes; a semiconductor element that is mounted on the substrate, the semiconductor element having a rectangular shape including a long side, a short side, and a corner portion, and having bumps connected to the electrodes; an underfill that is filled between the substrate and the semiconductor element and extends on the substrate around the semiconductor element; and an overcoat that covers the leads on the substrate. At least one of the plurality of leads that is connected to the electrode corresponding to the bump arranged nearest to the corner portion along the long side of the semiconductor element has a curved portion and is laid out, after the curvature, toward the short side of the semiconductor element in a plan view.

According to this application example, since the lead is covered by the underfill, the generation of bubble in the underfill at the bent portion of the lead can be suppressed, and a highly reliable semiconductor device in which corrosion of the lead is unlikely to occur can be provided.

Application Example 3

It is preferable that, in the semiconductor device described in the above application examples, above-referenced at least one of the plurality of leads that is laid out nearest to the corner portion of the semiconductor element is connected to a lead whose potential is the same as that lead or to a lead of the same signal line such that the leads after being connected are laid out as one lead.

According to this application example, even in a case where leads are laid out concentrated at a corner portion of the semiconductor element, a tendency to cause short-circuits due to narrowing between the leads can be eliminated.

Application Example 4

It is preferable that, in the semiconductor device described in the above application examples, the semiconductor element has a dummy bump, and at least the one of the plurality of leads that is laid out nearest to the corner portion is laid out between the dummy bump and a regular bump on the substrate in a plan view.

According to this application example, if the substrate is made of a flexible substrate such as a film base material or a thin PCB board, short-circuits between the leads and the semiconductor element due to the substrate being bent toward the semiconductor element when the pitch between bumps is large can be prevented.

Application Example 5

It is preferable that, in the semiconductor device described in the above application examples, the underfill is formed by an underfill material being dripped along one of the long sides of the semiconductor element, at least the one of the plurality of leads that is nearest to a corner portion of a long side opposite to the underfill material drip-side long side of the semiconductor element has the bent portion or the curved portion, and a lead that is nearest to a corner portion of the underfill material drip-side long side of the semiconductor element does not have the bent portion or the curved portion.

According to this application example, a region of the substrate located around the corner portion on the side of semiconductor element on which the underfill is dripped is covered by the underfill or the overcoat, and on the substrate around the corner portion on the other side of the semiconductor element, a region that is not covered by the underfill or the overcoat is generated. In this case, since the bent portion or the curved portion needs not to be provided to the drip-side leads, lead layout flexibility can be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with references to the diagrams. Note that, in the following diagrams, layers and members are enlarged by different scales such that the layers and the members can be recognizable. It should be understood that the embodiments described below are not intended to unduly limit the content of the invention recited in the claims.

Embodiment 1

Figure 1:
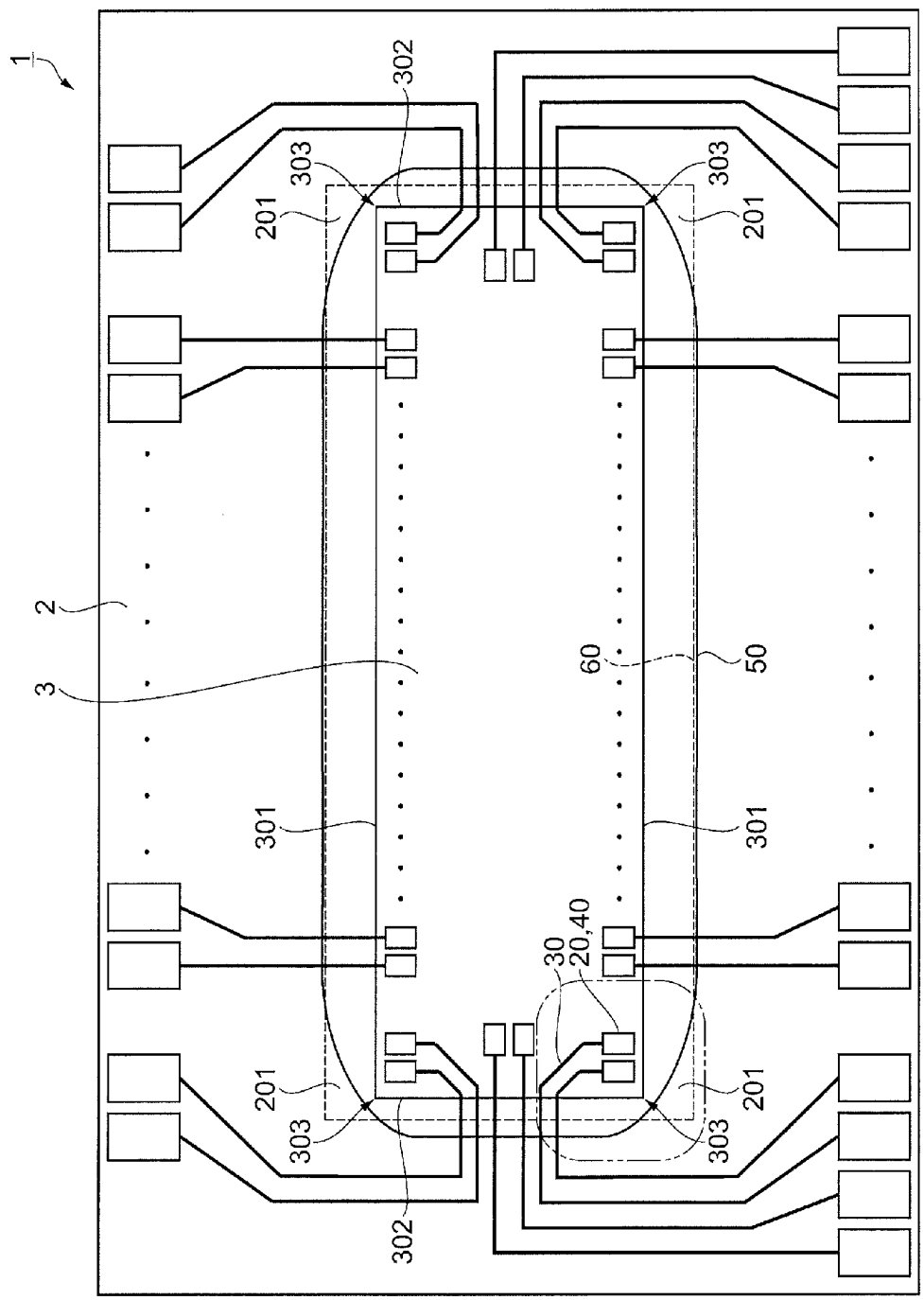
FIG. 1 is a plan view of a semiconductor device according to Embodiment 1.

FIG. 1 is a plan view of a semiconductor device 1 according to Embodiment 1 of the invention. The semiconductor device 1 according to the present embodiment includes a substrate 2 and a semiconductor element 3 that is mounted on the substrate 2. A PCB (Printed Circuit Board), a FPC (Flexible Printed Circuit), or the like is used as the substrate 2.

Electrodes 20 and a plurality of leads 30 that are connected to the respective electrodes 20 are formed on the substrate 2. The semiconductor element 3 is bonded on the substrate 2, and bumps 40 of the semiconductor element 3 are connected to corresponding electrodes 20. Note that FIG. 1 is a plan view of the semiconductor device 1 viewed from the semiconductor element 3 side, and for the sake of simplicity, electrodes 20 and corresponding bumps 40 are depicted by single boxes to show a state in which the electrodes 20 and the bumps 40 are connected to each other.

The semiconductor element 3 has long sides 301 and short sides 302, and the bumps 40 are formed along the sides. The electrodes 20 are formed on the substrate 2 such that each of the electrodes 20 is associated with a corresponding bump 40. The leads 30 are connected to the respective electrodes 20, and the leads 30 are laid out on the substrate 2 from inside of the semiconductor element 3 to the outside thereof in a plan view.

Here, "inside" refers to a region where the electrodes 20 overlap with the semiconductor element 3, and "outside" refers to a region outside the semiconductor element 3 in a plan view.

After the bonding of the semiconductor element 3, in order to fix the semiconductor element 3 to the substrate 2, an underfill 50 is dripped from one side of the semiconductor element 3, is caused to permeate between the semiconductor element 3 and the substrate 2, and is solidified, and as a result the semiconductor element 3 and the substrate 2 are fixed.

In addition to fixing the semiconductor element 3 and the substrate 2, the underfill 50 functions to prevent the plurality of leads 30 from corrosion caused by ambient air, moisture, or the like by covering the leads 30 that are laid out on the substrate 2. For this purpose, the underfill 50 extends on the substrate 2 around the semiconductor element 3, in addition to the space between the substrate 2 and the semiconductor element 3. Furthermore, in order to prevent the leads 30 that are laid out on the substrate 2 from corrosion, a overcoat 60 is formed in addition to the underfill 50 on the substrate to cover the leads 30.

Incidentally, since the underfill 50 is formed by an underfill material that is dripped at one side of the semiconductor element 3, permeated and hardened, the formation accuracy thereof is not good compared with that formed by a printing method, or the like. Specifically, edges of the underfill 50 that are formed around corner portions 33 of the semiconductor element 3 are formed in an arc shape in a plan view, and their sizes vary. Accordingly, a hollow region 201 tends to be generated between the underfill 50 and the overcoat 60 on the substrate 2 around the corner portions 303.

The leads 30 are laid out from the inside of the semiconductor element 3 to the outside thereof in a plan view, as described above. In order to lay out the leads 30 avoiding the hollow region 201, at least the lead 30 that is connected to the electrode 20 corresponding to the bump 40 provided nearest to the corner portion 303 along the long side 301 of the semiconductor element 3 is bent at a bent portion 31, after being led out from the electrode 20, and is laid out toward the short side 302.

Figure 2A:
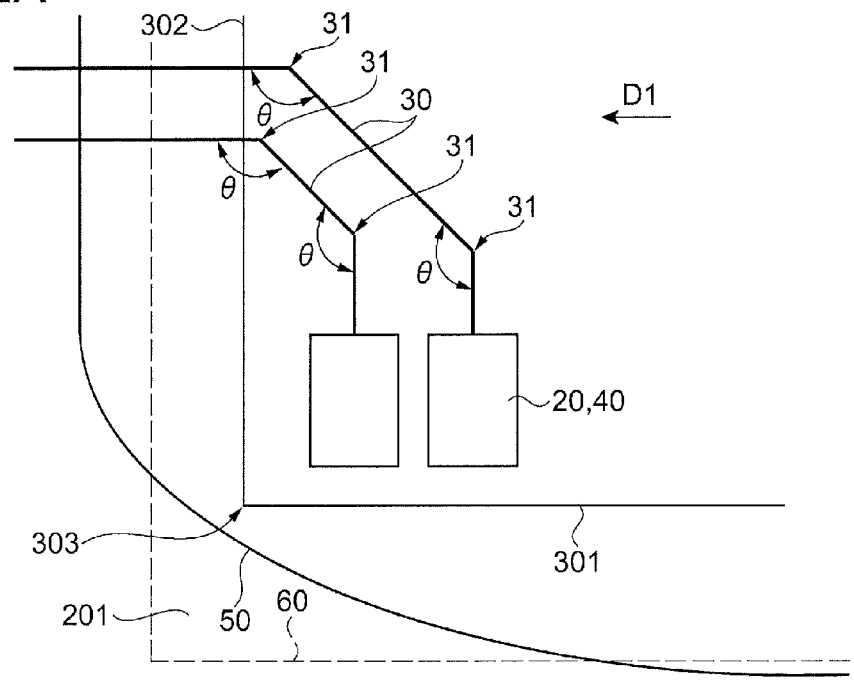
FIG. 2A is a detailed diagram of a lead bent portion of the semiconductor device according to Embodiment 1.

FIG. 2A is a detailed diagram of the bent portion 31 of the lead 30, and is a diagram in which a portion enclosed by the two-dot chain line in FIG. 1 is enlarged. In Embodiment 1, the corresponding leads 30 have at least two successive bent portions 31. Also, the directions D1 of bending are the same.

Here, "the directions of bending are the same" refers to a situation in which the angles formed at the bent portions 31 are each less than 180 degrees.

Due to having such shapes, the bending angles θ of the bent portions 31 of the leads 30 are larger than in the case where the lead 30 is laid out from the long side 301 to the short side 302 by one bent portion 31. Therefore, the fluidity of the underfill 50 along the bending direction D1 of the bent portion 31 can be improved, and the generation of bubbles inside the underfill 50 can be prevented.

Thus, according to the present embodiment, the lead 30 can be prevented from corrosion by exposure, and since bubbles can be prevented from being generated inside the underfill 50 along the bent portion 31, the lead 30 can be prevented from corrosion caused by the bubbles. Thus, a highly reliable semiconductor device 1 can be provided.

Figure 2B:
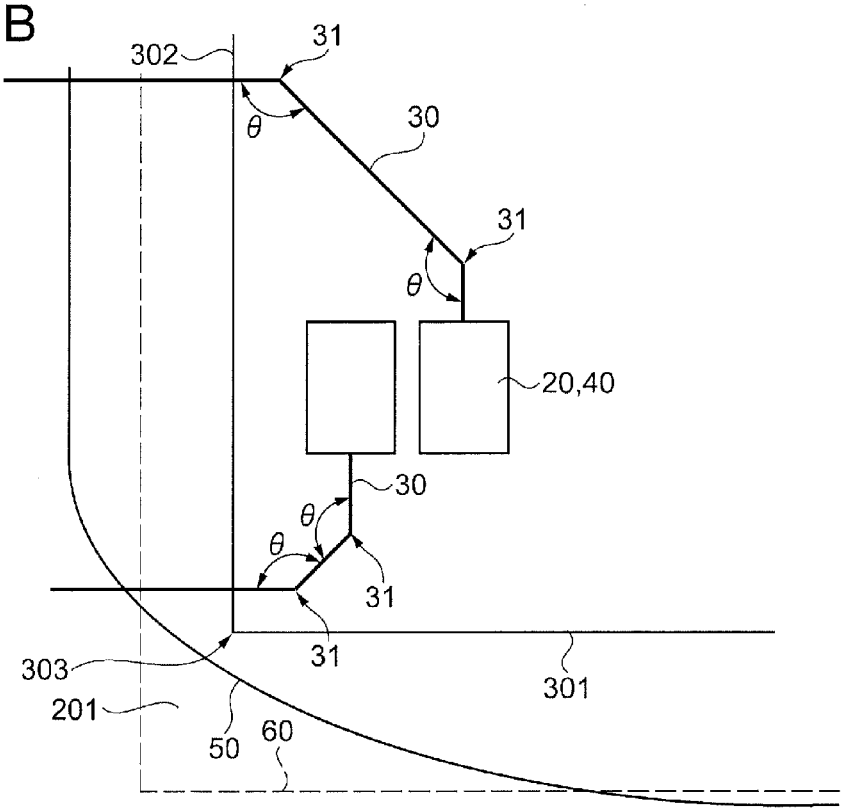
FIG. 2B is a detailed diagram of another lead bent portion of the semiconductor device according to Embodiment 1.

FIG. 2B is a detailed diagram of the bent portion 31 of the lead 30 similarly to FIG. 2A, and shows a layout pattern different from that shown in FIG. 2A.

Embodiment 2

Figure 3:
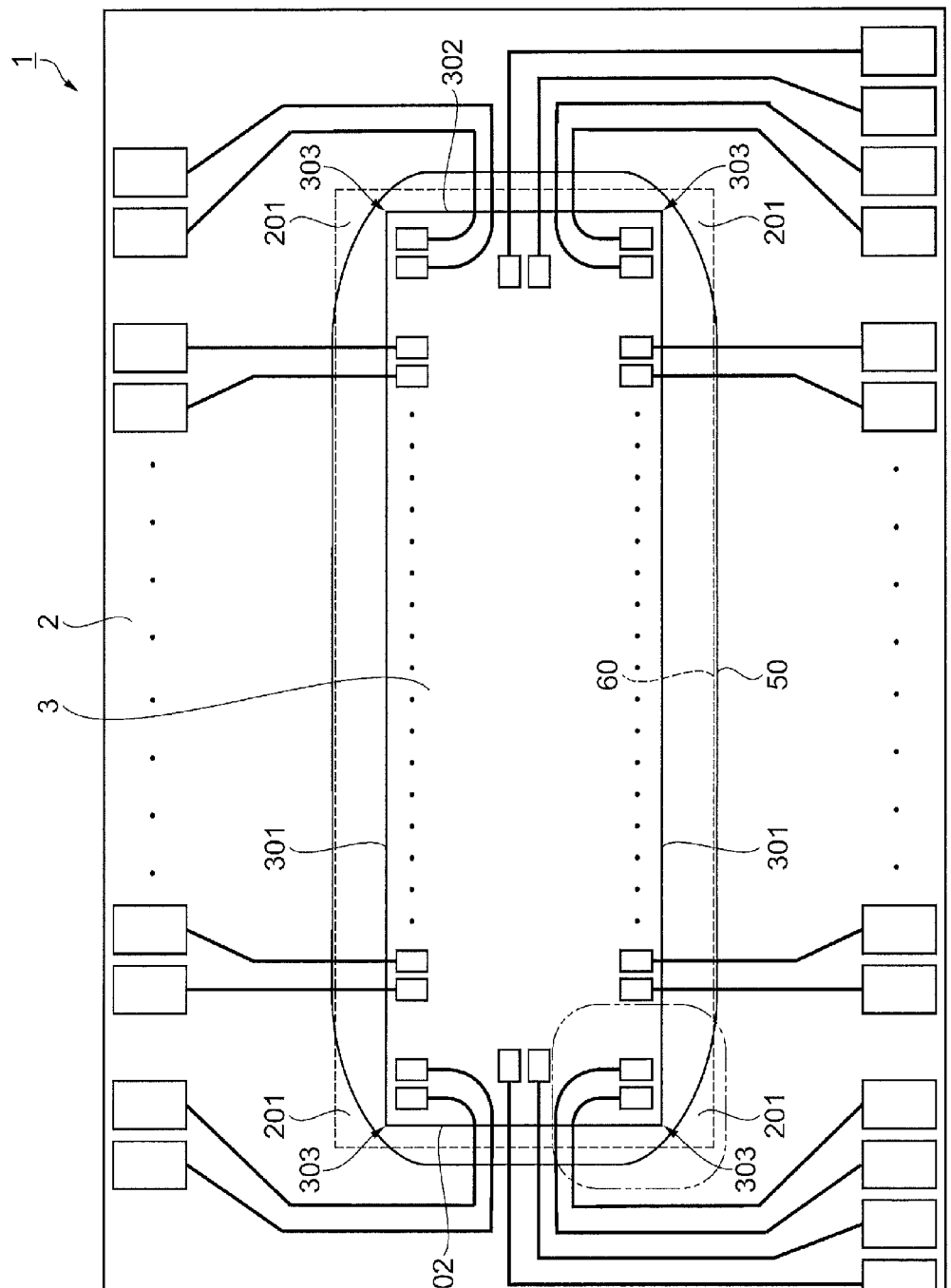
FIG. 3 is a plan view of a semiconductor device according to Embodiment 2.

FIG. 3 is a plan view of a semiconductor device 1 according to Embodiment 2 of the invention. Note that constituent elements of the present embodiment similar to those in Embodiment 1 are provided with the same reference numerals, and redundant description thereof will be omitted. Similarly, redundant description of similar effects will be omitted. The same is true for explanations following Embodiment 2.

In this embodiment, some of the leads 30 have a curved portion 32. At least the lead 30 that is connected to the electrode 20 corresponding to the bump 40 provided nearest to the corner portion 303 along the long side 301 of the semiconductor element 3 is curved at the curved portion 32 toward the short side 302, after being led out from the electrode 20, and is laid out to the outside.

Figure 4A:
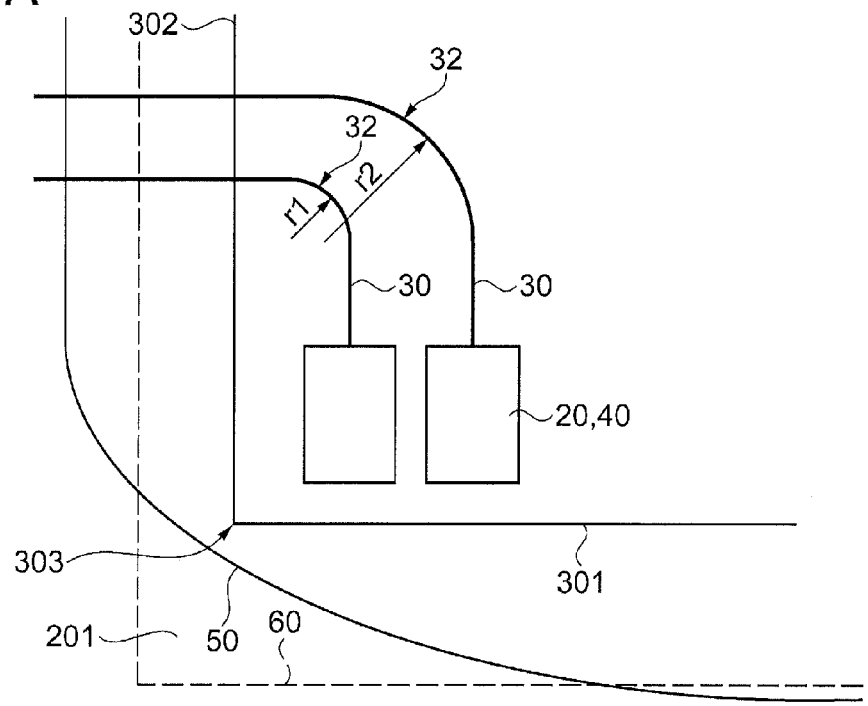
FIG. 4A is a detailed diagram of a lead bent portion of the semiconductor device according to Embodiment 2.

FIG. 4A is a detailed diagram of the curved portion 32 of the lead 30, and is a diagram in which a portion enclosed by the two-dot chain line in FIG. 3 is enlarged. In Embodiment 2, due to the corresponding lead 30 having the curved portion 32, the fluidity of the underfill 50 that permeates in contact with the lead 30 can be improved, and the generation of bubbles inside the underfill 50 along the lead 30 can be prevented.

Thus, according to the present embodiment, the lead 30 can be prevented from corrosion by exposure, and since bubbles can be prevented from being generated inside the underfill 50 along the lead 30, the lead 30 can be prevented from corrosion caused by the bubbles. Thus, a highly reliable semiconductor device 1 can be provided.

Figure 4B:
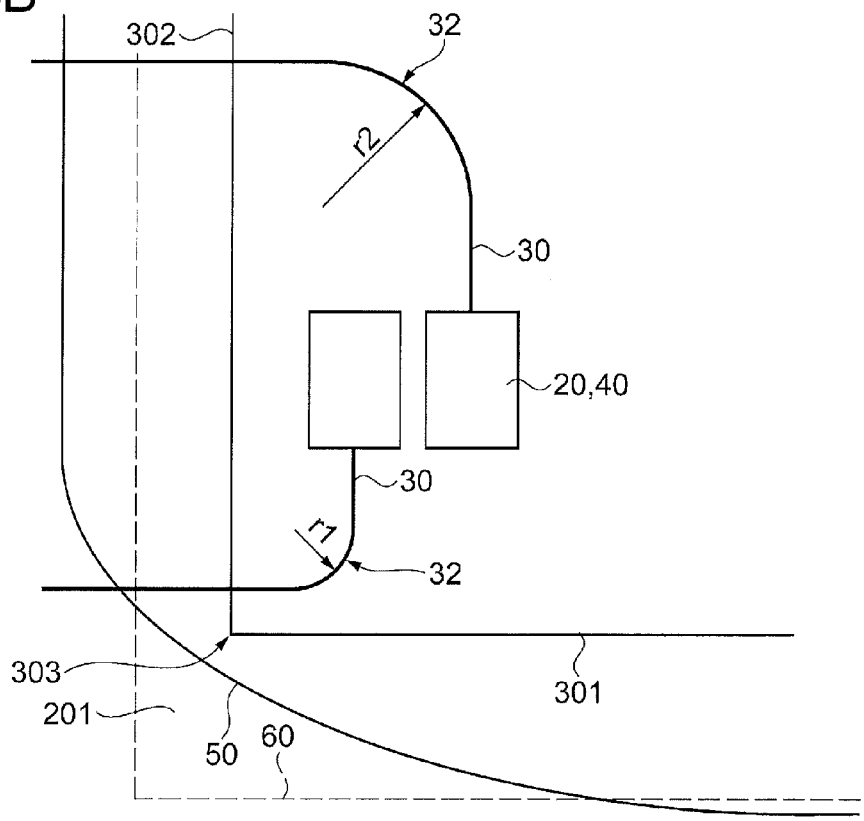
FIG. 4B is a detailed diagram of another lead bent portion of the semiconductor device according to Embodiment 2.

FIG. 4B is a detailed diagram of the curved portion 32 of the lead 30 similar to FIG. 4A, and shows a layout pattern different from that shown in FIG. 4A.

Embodiment 3

Figure 5A:
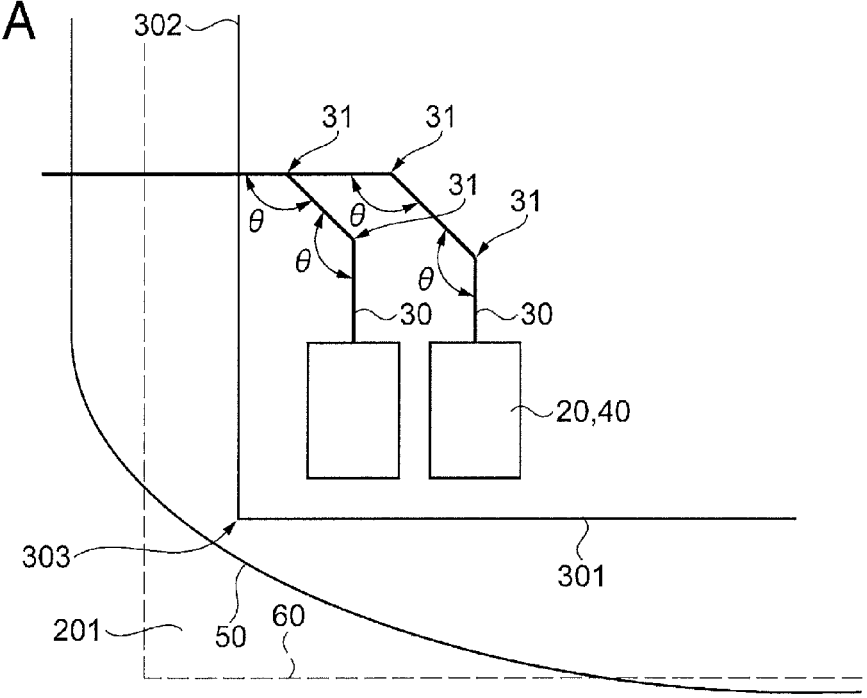
FIG. 5A is a plan view of a semiconductor device according to Embodiment 3.
Figure 5B:
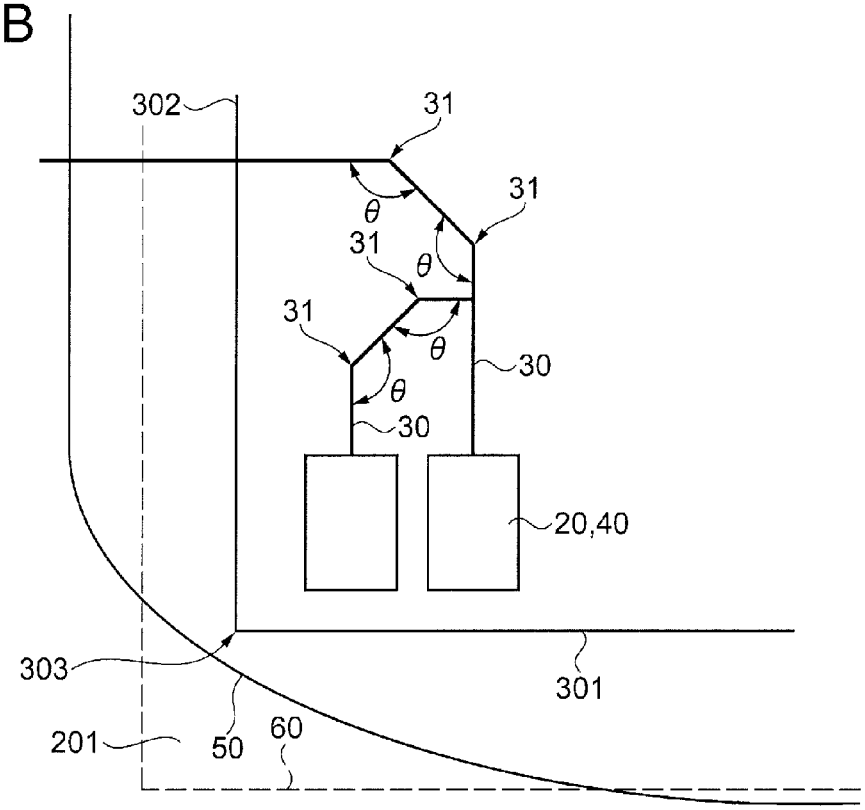
FIG. 5B is a plan view of another example of the semiconductor device according to Embodiment 3.

FIGS. 5A and 5B are enlarged views of layout portion of some of the leads 30 of the semiconductor device 1 according to Embodiment 3 of the invention. In the embodiment, at least the lead 30 that is connected to the electrode 20 corresponding to the bump 40 provided nearest to the corner portion 303 along the long side 301 of the semiconductor element 3 is connected to a lead whose potential is the same as the lead 30 or to another lead 30 of the same signal line such that the leads 30, after being connected, are laid out as one lead 30.

According to the present embodiment, in addition to the effects of Embodiment 1 and 2, the following effect can be obtained.

Even in a case where the leads 30 are laid out near the corner portion 303 of the semiconductor element 3 in a dense manner, distances between the leads 30 can be prevented from becoming small and thus the tendency for short-circuiting can be eliminated. For example, a power supply line or a grounding line, for example, can be laid out in such a manner.

Embodiment 4

Figure 6A:
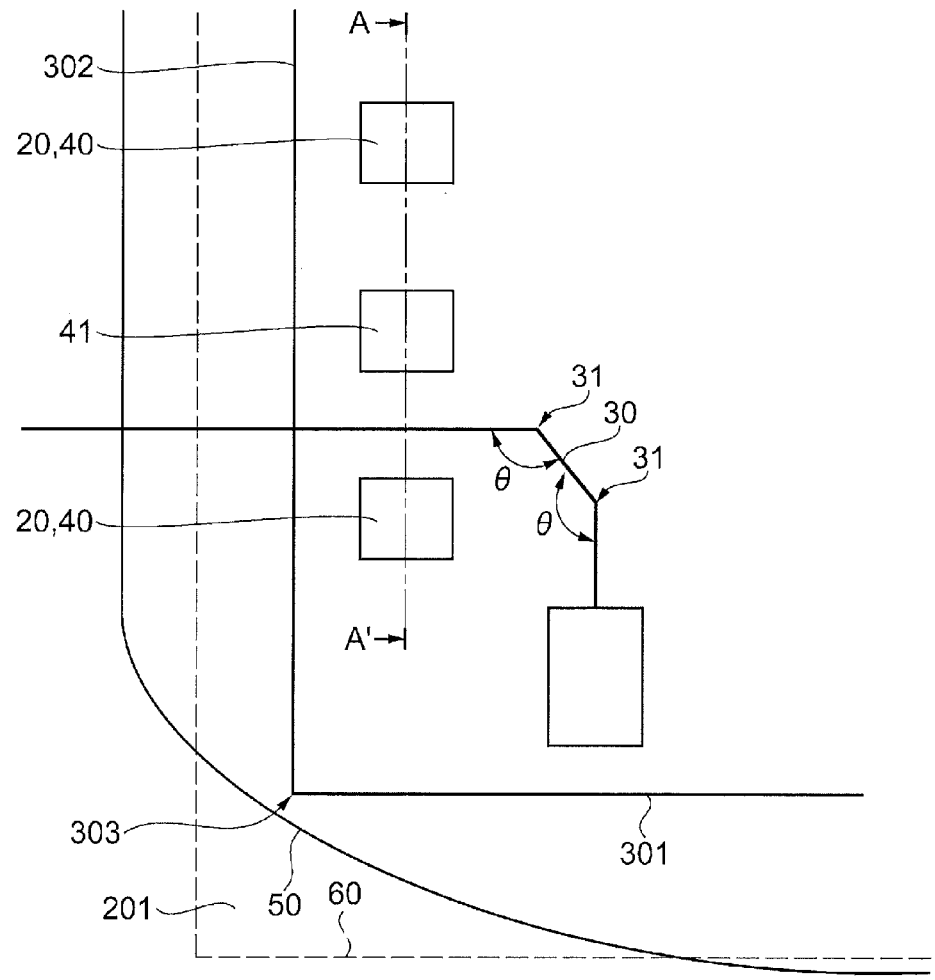
FIG. 6A is a plan view of a semiconductor device according to Embodiment 4.
Figure 6B:
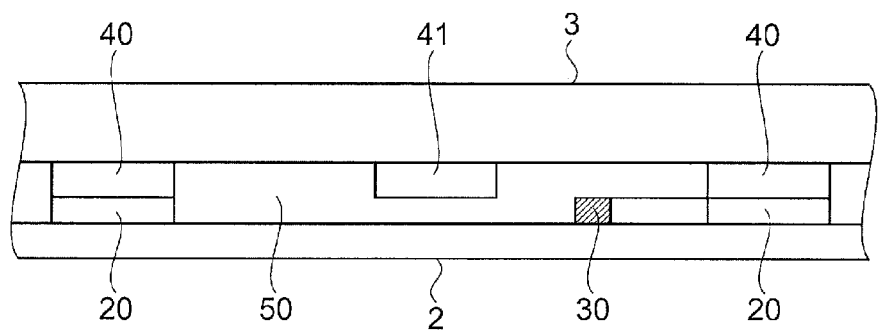
FIG. 6B is a cross-section of a semiconductor device according to Embodiment 4.

FIG. 6A is an enlarged plan view of a layout of the lead 30 of the semiconductor device 1 according to Embodiment 4 of the invention. A cross-section taken along the line A-A' in FIG. 6A is shown in FIG. 6B.

The substrate 2 of the semiconductor device 1 in the present embodiment uses a flexible base material such as a relatively thin PCB or FPC. Furthermore, in the present embodiment, since the distance between the electrodes 20 is formed to be large, in order to prevent the lead 30 on the substrate 2 and the active face of the semiconductor element 3 from short-circuiting due to the substrate 2 being bent, a dummy bump 41 is provided between bumps 40 that correspond to the respective electrodes 20 on the semiconductor element 3.

In the present embodiment, at least the lead 30 that is connected to the electrode 20 corresponding to the bump 40 provided nearest to the corner portion 303 along the long side 301 of the semiconductor element 3 is laid out between the dummy bump 41 and a regular bump 40 on the substrate 2 in a plan view.

According to the present embodiment, in addition to the effects of Embodiment 1 to 3, the following effect can be obtained.

Even in a case where the substrate 2 is made of a flexible base material and the pitch between bumps is large, the leads 30 and the active face of the semiconductor element 3 can be prevented from short-circuiting.

Embodiment 5

Figure 7:
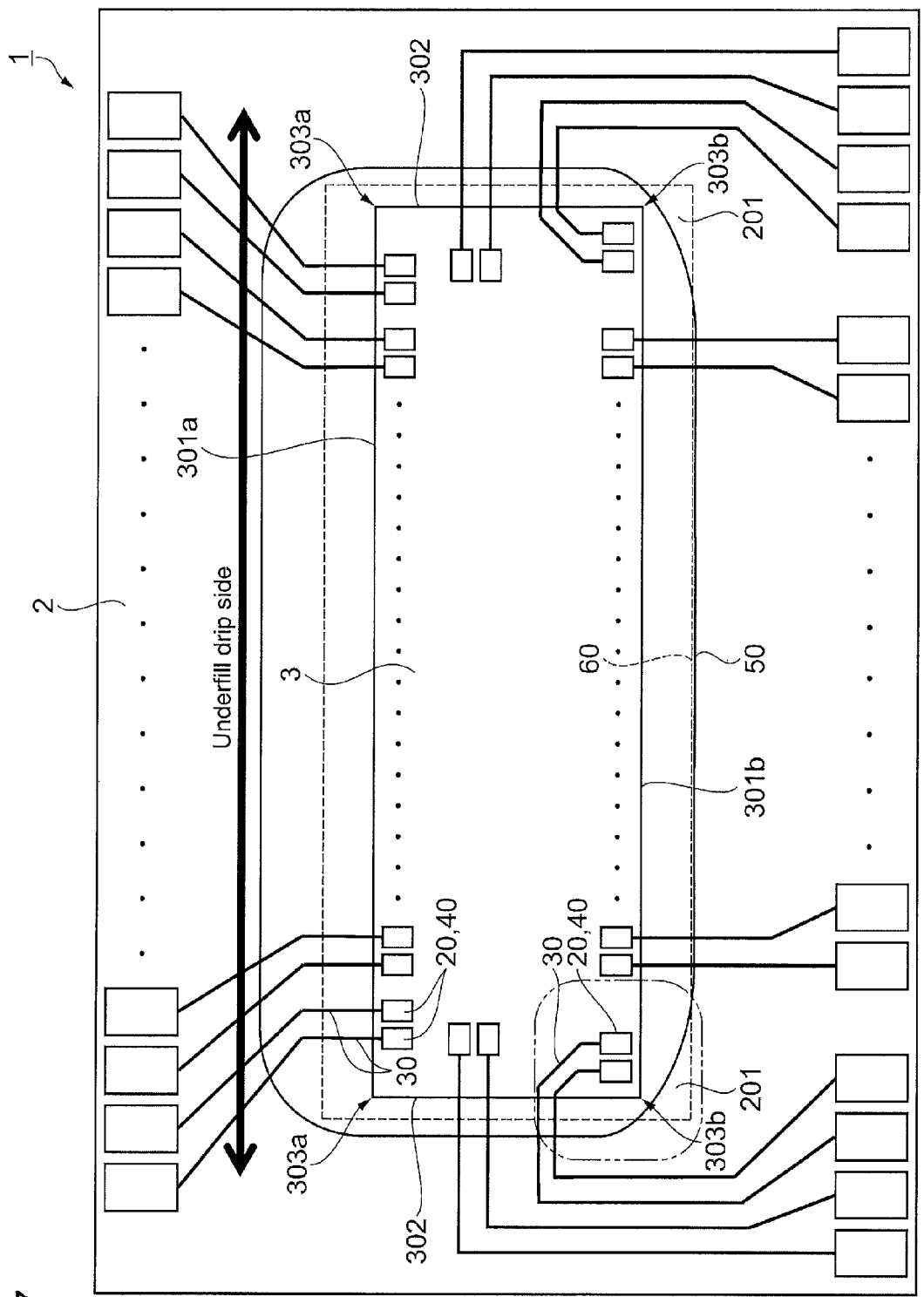
FIG. 7 is a plan view of a semiconductor device according to Embodiment 5.

FIG. 7 is a plan view of a semiconductor device 1 according to Embodiment 5 of the invention. In the semiconductor device 1 of the present embodiment, the hollow regions 201 are not formed on the substrate 2 around corner portions 303a of the semiconductor element 3 that are located at the side thereof to which the underfill 50 is dripped. On the other hand, the hollow regions 201 are formed on the substrate 2 around corner portions 303b of the semiconductor element 3 that are located at the side thereof to which the underfill 50 is not dripped.

In the present embodiment, at least the lead 30 that is connected to the electrode 20 corresponding to the bump 40 provided nearest to the corner portion 303b along the long side 301b of the semiconductor element 3 is, after being led out from the electrode 20, laid out toward the short side 302 in a similar layout pattern shown in Embodiment 1 or 2.

On the other hand, the leads 30 that are connected to the electrodes 20 along the long side 301a are laid out outside the semiconductor element 3 in a plan view across the long side 301a without being laid out to the short side 302 side.

According to the present embodiment, in addition to the effects of Embodiment 1 to 4, the following effect can be obtained.

According to the present embodiment, since the bent portion 31 or the curved portion 32 need not be provided to the leads 30 that are connected to the electrodes 20 along the long side to which the underfill 50 is dripped, the degree of layout flexibility can be improved.

What is claimed is:

1. A semiconductor device comprising:
   a substrate including a plurality of electrodes and a plurality of leads that are connected to the electrodes;
   a semiconductor element that is mounted on the substrate, the semiconductor element having a rectangular shape including a long side, a short side, and a corner portion, and having bumps connected to the electrodes;
   an underfill that is filled between the substrate and the semiconductor element and extends on the substrate around the semiconductor element;
   an overcoat that covers the leads on the substrate; and
   a hollow region formed on the substrate around the corner portion;
   wherein at least one of the plurality of leads that is connected to the electrode corresponding to the bump arranged nearest to the corner portion along the long side of the semiconductor element has at least two successive bent portions that are bent in the same direction and is laid out toward the short side of the semiconductor element in a plan view, and the at least one of the plurality of leads is laid to avoid the hollow region.

2. The semiconductor device according to claim 1, wherein the at least one of the plurality of leads that is laid out nearest to the corner portion of the semiconductor element is connected to a lead whose potential is the same as that lead or to a lead of the same signal line such that the leads after being connected are laid out as one lead.

3. The semiconductor device according to claim 1, wherein the semiconductor element has a dummy bump, and at least the one of the plurality of leads that is laid out nearest to the corner portion is laid out between the dummy bump and a regular bump on the substrate in a plan view.

4. The semiconductor device according to claim 1, wherein the underfill is formed by an underfill material being dripped along one of the long sides of the semiconductor element, at least the one of the plurality of leads that is nearest to a corner portion of a long side opposite to the underfill material drip-side long side of the semiconductor element has the at least two successive bent portions, and a lead of the plurality of leads that is nearest to a corner portion of the underfill material drip-side long side of the semiconductor element does not have the at least two successive bent portions.

5. The semiconductor device according to claim 1, wherein an extension amount of the underfill in a region on the substrate adjacent to the corner portion of the semiconductor element is smaller than an extension amount of the underfill in regions adjacent the long and short sides of the semiconductor element.

6. The semiconductor device according to claim 1, wherein the at least two successive bent portions are located inside of the semiconductor element in the plan view.

7. A semiconductor device comprising:
   a substrate including a plurality of electrodes and a plurality of leads that are connected to the electrodes;
   a semiconductor element that is mounted on the substrate, the semiconductor element having a rectangular shape including a long side, a short side, and a corner portion, and having bumps connected to the electrodes;
   an underfill that is filled between the substrate and the semiconductor element and extends on the substrate around the semiconductor element;
   an overcoat that covers the leads on the substrate; and
   a hollow region formed on the substrate around the corner portion;
   wherein at least one of the plurality of leads that is connected to the electrode corresponding to the bump arranged nearest to the corner portion along the long side of the semiconductor element has a curved portion and is laid out, after the curvature, toward the short side of the semiconductor element in a plan view, and the at least one of the plurality of leads is laid to avoid the hollow region.

8. The semiconductor device according to claim 7, wherein the underfill is formed by an underfill material being dripped along one of the long sides of the semiconductor element, at least the one of the plurality of leads that is nearest to a corner portion of a long side opposite to the underfill material drip-side long side of the semiconductor element has the curved portion, and a lead of the plurality of leads that is nearest to a corner portion of the underfill material drip-side long side of the semiconductor element does not have the curved portion.

9. The semiconductor device according to claim 7, wherein an extension amount of the underfill in a region on the substrate adjacent to the corner portion of the semiconductor element is smaller than an extension amount of the underfill in regions adjacent the long and short sides of the semiconductor element.

10. The semiconductor device according to claim 7, wherein the curved portion is located inside of the semiconductor element in the plan view.

* * * * *